US008433000B2

(12) United States Patent
Den Besten et al.

(10) Patent No.: US 8,433,000 B2
(45) Date of Patent: Apr. 30, 2013

(54) METHOD AND CIRCUIT FOR RECEIVING DATA

(75) Inventors: Gerrit Willem Den Besten, Eindhoven (NL); Erwin Janssen, Veldhoven (NL)

(73) Assignee: NXP B.V., Eindhoven (NL)

( * ) Notice: Subject to any disclaimer, the term of this patent is extended or adjusted under 35 U.S.C. 154(b) by 622 days.

(21) Appl. No.: 12/516,782

(22) PCT Filed: Nov. 28, 2007

(86) PCT No.: PCT/IB2007/054816
§ 371 (c)(1),
(2), (4) Date: May 28, 2009

(87) PCT Pub. No.: WO2008/065615
PCT Pub. Date: Jun. 5, 2008

(65) Prior Publication Data
US 2010/0172457 A1   Jul. 8, 2010

(30) Foreign Application Priority Data

Nov. 29, 2006   (EP) ..................................... 06125048

(51) Int. Cl.
*H03D 3/18*   (2006.01)
*H03D 3/24*   (2006.01)
(52) U.S. Cl.
USPC ......................................................... 375/327
(58) Field of Classification Search .................. 375/355, 375/359, 376, 375, 327, 272, 240; 360/51
See application file for complete search history.

(56) References Cited

U.S. PATENT DOCUMENTS

| 5,164,965 | A | | 11/1992 | Karaali |
| 5,642,243 | A | * | 6/1997 | Bliss ................................ 360/51 |
| 5,987,082 | A | * | 11/1999 | Fujimoto ...................... 375/355 |
| 6,111,926 | A | | 8/2000 | Imamura et al. |
| 6,466,630 | B1 | * | 10/2002 | Jensen ........................... 375/327 |
| 6,628,212 | B1 | * | 9/2003 | Toutant ............................ 341/70 |
| 6,907,096 | B1 | | 6/2005 | Lueker et al. |
| 2003/0210756 | A1 | | 11/2003 | Ito |
| 2008/0072093 | A1 | * | 3/2008 | Baumgartner et al. ........ 713/400 |

OTHER PUBLICATIONS

Wallberg, A Digital Phase-Locked Loop for Hard Disk Drive Read channel Applications, May 1997.*
Wallberg, A Digital Phase-Locked Loop for Hard Disk Drive Read channel Applications, May 1997, Massachesetts Institute of Technology.*
Wallberg, A Digital Phase-Locked Loop for Hard Disk Read Channel Application, May 1977, Massachussetts Institute of Technology.*

* cited by examiner

*Primary Examiner* — David C. Payne
*Assistant Examiner* — Wednel Cadeau

(57) ABSTRACT

The invention relates to a circuit and method for receiving a signal of which—at the receiver end—the frequency is basically unknown. By sampling the data and deriving the frequency of the signal (or actually: the data rate of the data carried by the signal) and setting a phase locked loop in the receiver to the derived—estimated—circuit, the receiver can very quickly tune in to the frequency of the signal. Hence, no embedded or accompanying clock is required for the signal. Oversampling of the signal by the receiver front end is preferred, though.

14 Claims, 9 Drawing Sheets

METHOD AND CIRCUIT FOR RECEIVING DATA

FIELD OF THE INVENTION

In one aspect, the invention relates to a method of receiving data. In a further aspect, the invention relates to a circuit for receiving data. In another aspect, the invention relates to a system for processing data. In yet a further aspect, the invention relates to a computer programme product.

BACKGROUND OF THE INVENTION

There are two main types of high-speed serial interface clocking solutions: source-synchronous and embedded clock. For embedded clock solutions the data stream must include sufficient clock information in order to synchronize the receiver in a reliable way. Embedded clock solutions can run at higher rates because there is no data-clock transmission-path matching issue. However, the embedded clock receiver needs clock and data recovery (CDR), compared to the straightforward data slicing with the provided clock in the source-synchronous case.

Embedded clock type solutions can be subdivided in a few categories:

1. A synchronous full-rate or half rate bit clock or any other lower frequency clock with a fixed and known ratio (e.g. byte or word clock) is transmitted from TX to RX, but it is not kept phase-synchronized with the data. TX and RX share the same clock frequency (or a known and fixed ratio), and the receiver only needs to do phase alignment (and clock multiplication in case a lower frequency fixed-ratio clock is transmitted).

2. The receiver does not get a reference clock signal from the transmit side, but the receiver locks to the embedded clock in the data stream and recovers that way both clock and data information from it. This is possible if the data stream is properly encoded to include sufficient clock information. For binary transmission this can for instance be achieved with 8B10B codes. In order to avoid false locking on (sub)harmonics there must be either some locking aid provided or the data encoding must implicitly provide sufficient frequency information (eg. bi-phase, Manchester code). For coding efficiency reasons using locking aids are preferred in many cases. Locking aids can for instance be a local receiver reference clock, which helps to become close to the data rate, and/or a training sequence in the data stream.

3. The receiver does not get a reference clock signal from the transmit side, but transmitter and receiver each have a local reference clock, which frequencies are known to be close together (ppm's difference), but not exactly equal (plesiochronous clocks). The receiver clocks remain locked to the local reference and data is recovered in the digital domain by over-sampling the data stream.

If the receiver clock signal locks on the local reference before data is transmitted, and then synchronizes to the data stream with a training sequence before actual payload data transmission, the local reference clock functions as locking aid and this is covered under option 2.

Type 2 and 3 require fewer connections then type 1 (or source synchronous solutions), as they do not need a separate clock signal to be transmitted. However, for type 2 the synchronization becomes more complicated because, besides phase synchronization, the receiver must first lock to the right frequency before reliable data reception becomes possible. Type 3 solutions can start-up rather fast using the knowledge that the reference frequencies are very close and provided that the clock signals are operational. However, this type 3 conventionally requires availability of nearly equal reference frequencies at both ends, which might not be trivial and may require additional reference (probably crystal) oscillators in the system. Type 1 is less attractive because it implies more connections and costs more 10 power then types 2 and 3.

OBJECT AND SUMMARY OF THE INVENTION

It is an object of the invention to provide a more flexible circuit for receiving data. In a first aspect, the invention provides a method of receiving data by a receiver comprising a phase locked loop, the data being carried by a signal having a frequency unknown by said receiver, the method comprising the steps of: sampling the signal at a pre-determined sampling rate; estimating the frequency of the detected signal; setting the frequency of the phase locked loop to match the estimated frequency; setting the phase of the phase lock loop to zero for the estimated zero phase error; running the phase locked loop for a pre-determined amount of cycles; when the phase locked loop has not locked on the phase of the incoming signal after the pre-determined amount of cycles, repeating the previous two steps until the phase is locked.

By sampling and analyzing the incoming signal and the frequency of the incoming signal can be obtained. By setting the phase locked loop directly to this frequency, the settling time of the phase locked loop can be significantly reduced. This settling time can even be further reduced by continuously, with a certain interval, setting the phase error of the phase locked loop to zero.

In one embodiment of the method according to the invention, the pre-determined sampling rate is equal to at least two times the maximum frequency that the signal is expected to have.

In this way, the risk of aliasing and therefore data loss is significantly reduced.

In another embodiment of the method according to the invention wherein the step of sampling the signal is performed by multiple sampling units, each sampling unit having a different sampling phase, and the method further comprising the step of aligning output signals of the multiple sampling units.

In this way, the sample rate can be increased without increasing the operating frequency of the circuit.

In a further embodiment of the method according to the invention, the step of estimating the frequency of the detected signal comprising the sub-steps of: interpreting the sampled values as either being a logical 1 or a logical 0; detecting transitions in the consecutively sampled and interpreted values; feeding information on the transitions to a phase-frequency detector of a further phase locked loop; and utilising the output of the oscillator of the phase locked loop to estimate the frequency of the signal.

BRIEF DESCRIPTION OF THE FIGURES

These and other aspects of the invention will now be elucidated by means of Figures, in which.

DESCRIPTION OF EMBODIMENTS

The asynchronous receiver sees a data stream at its input at a certain data rate BIN [bits/sec]. The receiver samples the input data at fS, where fS>BIN, in order to have at least one sample per bit. This absolute minimum sample rate requirement is only sufficient in case of perfect building blocks and ideal signals. In practice fS>>1, while edges of data and clock signals are jittered and building blocks are not prefect. The higher the over-sampling ratio the more jitter the receiver can tolerate. In practice, for over-sampling receivers often sample rates values fS>k·BIN are used, with k~3.

While the conventional over-sampled receiver solutions either use a k value equal or very close to an integer value, the invented receiver concept can handle k values over a wide range. Therefore, the incoming data neither has to be synchronous nor plesiochronous to the receiver clock, but the received data can be completely asynchronous to the local receiver clock.

Figure 7:
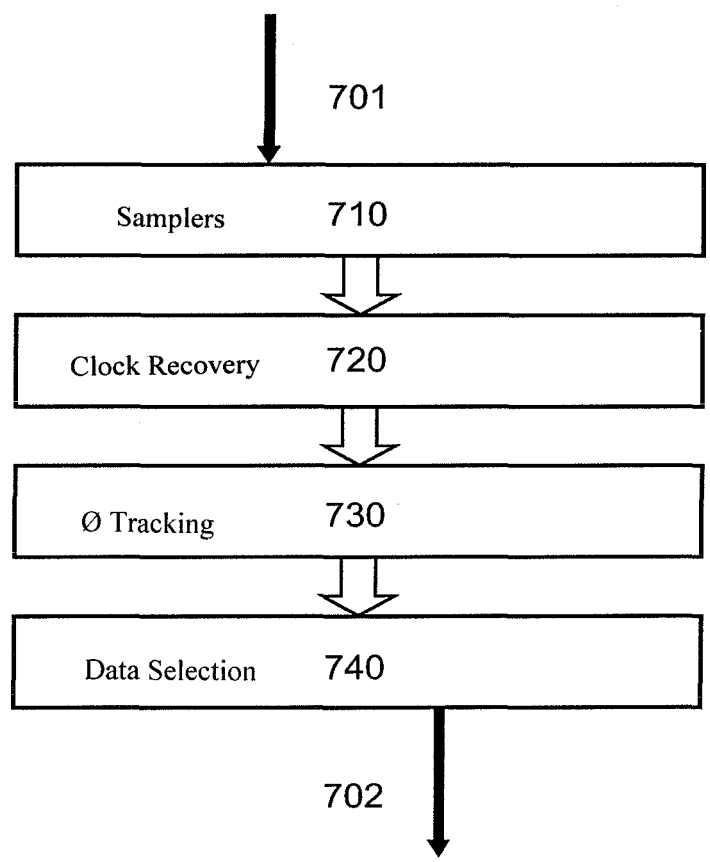
FIG. 7 shows basic functions performed by the digital processing.

The data samples are delivered to a digital sample-processing unit, which recovers the original data bits from the samples. The FIG. 7 shows the basic functions performed by the digital processing. The clock period is extracted from the data samples by means of a digital data-recovery PLL. This determines the bit-period, also called unit-interval (UI), which is counted in number of sample intervals 1/fS. Therefore UI=Q/fS, where Q is a real or fractional number (in practice likely to be fractional due to required truncation in practical implementations) that represents the actual over-sampling ratio.

Starting from recovered bits, with the UI value, the centre and edge position of next bits can be predicted and the predicted edge positions can be compared with the real occurrence of edges, which provides control information for the PLL loop. This is illustrated in the figure on FIG. 3. Absent edges in the data stream are neglected and do not have a phase and frequency control impact. Phase errors are filtered in order to avoid strong impact of short-term edge-shifting effects like Inter-Symbol-Interference (ISI) and Jitter. Long-term effects like slow frequency variations are tracked.

This implies that the sampling clock frequency provided by a separate (analog) clock generating PLL does not have to be fully stabilized before reliable transmission, if the frequency variations are slow enough to be tracked by the digital recovery loop.

At system start-up, the bit-rate of the transmitter is not known at the receiver side. The clock frequency of the receiver is also unknown. This means the number of samples per bit is unknown and may vary over a wide range.

In order to reliably detect the length of a transmitted bit, where the length is expressed in a fractional number of samples Q (bit period time=Q·TSAMPLE), some additional information is required to remove the possibility of false-lock. For example, if the transmission would start with data bits, and the bit period is not known, the PLL could for example lock on the sequence 010101 but equally well on the sequence 00110011. In the second case the detected frequency would be only half of the actual frequency.

As is clear, it is impossible to obtain instantaneous frequency lock on a data signal without additional constraints. This additional information could be either the (approximate) bit period or knowledge about the initially transmitted data sequence.

If a reasonably accurate estimate of the bit period is already available, this can be directly loaded in the digital PLL. If such an estimate is not available it can be obtained by a (short) initialization sequence in the data stream. After initialization by setting a bit-period-estimate, the recovery unit must be trained by some training sequence before transmitting payload data. Therefore, in order to enhance start-up behavior, it is advantageous to use a (short) initialization before training the link and all that before actual data transmission.

Any known init sequence, with guaranteed edges and known edge positions, can be used for initial frequency and phase estimates. For example a toggling sequence easily provides a 'UI estimation' by counting the number of sample intervals over a predefined number of bits and determining QESTIMATE=#samples/#bits.

After the estimation of the bit period during initialization, the digital data recovery must be trained to lock on the data.

Although the estimation period and the phase training period can potentially consist of different bit patterns, this might in most practical case not be necessary or desired if a suitable pattern is chosen.

For example, the transmission starts with the toggling init-sequence 0101010 . . . 01 and ends with a special code to indicate the end of the init sequence. A certain exception code of the line coding may be used for this. After the initialization sequence (bit period estimation and data recovery training), the actual user data can be transmitted. The by the receiver sampled init sequence will look for instance like 000011110001111110000 . . . 00001111 because of the over-sampling. By measuring the number of samples and dividing this number by the number of received bits, the estimated average number of samples per bit (QESTIMATE) is obtained. In case of a toggling sequence the number of received bits #bits can be determined by counting the number of transitions (#edge) in the measurement interval.

In order to obtain the average bit length with high accuracy, the number of received bits needs to be large, which is in contrast with the goal of fast lock. Therefore, the average bit period will not be determined with high precision but only a small number of bits will be used to determine the approximate average period. The PLL period register will be loaded with approximated average period.

Alternatively, the average bit period can be obtained with a Kalman filter, instead of using the procedure of dividing the number of received samples by the number of received bits.

The phase locking procedure starts after the average estimated bit period has been determined. The first action is to set the phase of the digital PLL such that zero phase error is present. This is possible because the signal on which the PLL locks is available, and thus the exact transition locations are known. If the estimated bit period is 100% correct, the average phase error will stay zero (the instantaneous phase error will deviate from zero because the bit period will be non-integer, whereas the transitions that are used for determining the phase error are on an integer based grid). On the other hand, if the estimated period is too small, the phase error will start to grow. The PLL reacts to this by increasing the period. If the increments in phase error are not too large, the PLL will be able to adjust the period fast enough and finally obtain a state with zero (average) phase error and zero frequency error. On the other hand, if the estimated period is off by a large amount, the phase error will grow very fast and the PLL will not be able to compensate fast enough by increasing the period. At some point the phase error will become 180 degrees, which will result in the PLL skipping a cycle. It will now look like the PLL has an estimated period that is too large. The result is thus that instead of increasing the period, the period is decreased. In the end, the PLL will obtain a lock, but this may take hundreds or even thousands of cycles, just as with a normal analog PLL. To avoid this long start-up sequence and aid the PLL in obtaining a lock, the PLL phase can be corrected every N cycles to give a zero phase error. This will prevent to PLL ever obtaining a 180-degree error, even if the estimated period is incorrect. The procedure is thus as follows:

1. obtain an estimate for the period
2. set the PLL phase for zero phase error
3. run the PLL for N cycles without interfering
4. go back to step 2 until phase/frequency lock obtained Once phase-lock has been obtained, reliable data reception is possible and the end of initialization and training can be communicated, for instance by means of a exception word of the line coding. After detection of this code, normal data is received and the PLL will remain in lock using this data.

Figure 1:
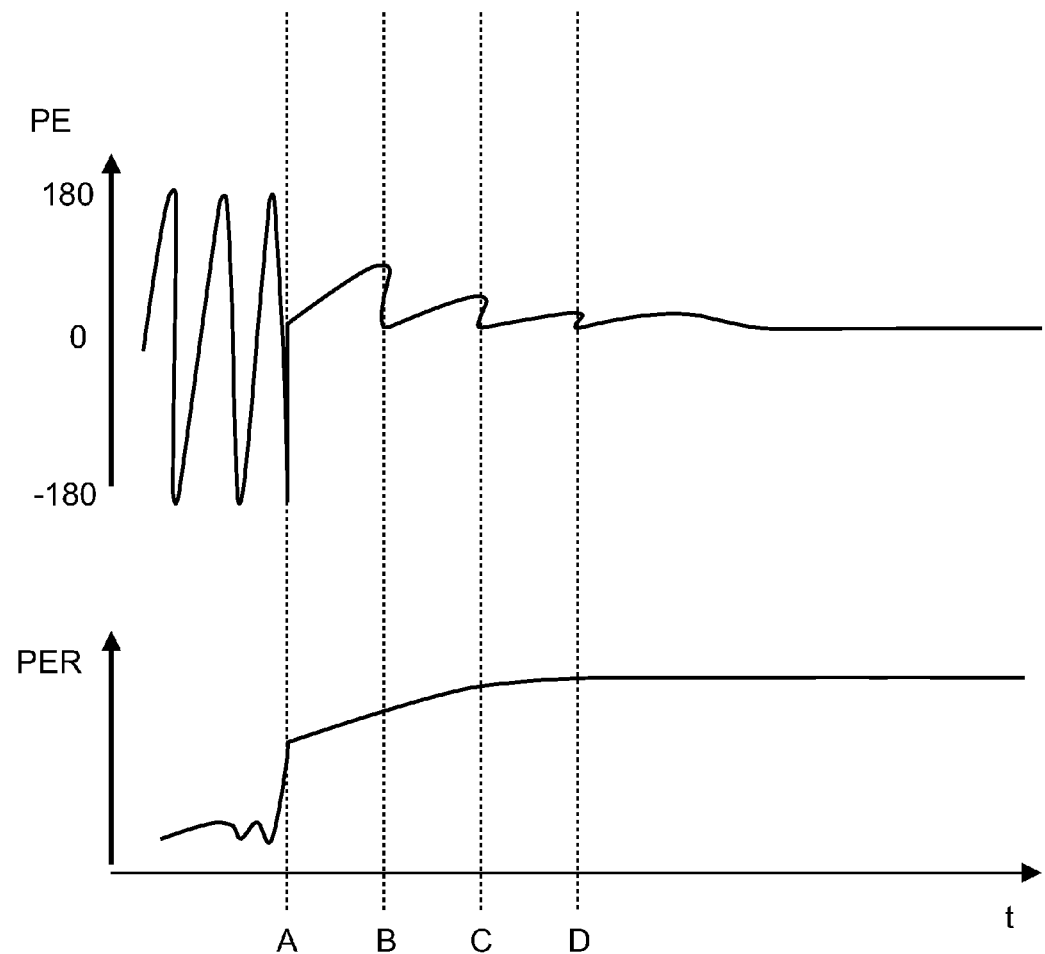
FIG. 1 shows output characteristics of a circuit.

FIG. 1 illustrates the phase/frequency lock procedure. Here, the phase error PE and the period PER are depicted over time t. At time A, an estimate of the bit period has been determined and is provided to the PLL. At the same time, the phase is set for zero phase error. It can be seen that the phase error increment is smaller now, but since the PLL is not yet in lock the phase error continuous to grow. At time B, the phase is set to again cause zero phase error. Meanwhile, the PLL keeps updating the estimate for the period, which results in smaller increments in the phase error. At time C, as well as at time D, the phase is again set for zero phase error. The PLL frequency is now very close to the frequency of the incoming data and the PLL is in lock.

Depending on signal quality and the resulting minimum required over-sampling ratio QMIN, this kind of receiver can receive data at any rate BIN=fS/QMIN. In practice, for hardware reasons it is not very practical to support a huge range of Q values. However, a receiver implementation that supports a Q range that exceeds an octave of bit rates is sufficient as all slower rates can be achieved by throwing away samples (sub-sampling) before the digital recovery.

It is possible to use the OSR information to control the clock generation frequency towards an integer of simple fractional multiple of the average data rate. This allows reducing the operational amount of data recovery logic after the initial start-up period and phase and frequency stabilization.

However, the asynchronous receiver concept allows maintaining independent clock systems at both ends. Therefore in case of a dual-simplex link configuration it is easily possible to use only one PLL (or DLL) for frequency multiplication for both TX and RX at each side. Therefore, it would in many cases not be desirable to control the clock frequency, but to keep the frequencies at both ends independent.

The large absolute frequency tolerance for the clocks for the invented receiver solution allows using lower quality reference clocks then traditional crystal based references, as long as frequency and phase are changing slow enough. These lower quality clock references may include ceramic resonator device, LC-tanks, MEM devices, or even gm-C, RC, or relaxation type of oscillators with a low quality factor.

Most importantly, it allows using a clock that is already available in the system for other application reasons. For example, this may reduce the amount of required (external) reference clock circuits and devices and furthermore it can reduce the amount of clock domains inside a package.

The digital data recovery block is the core functionality of the invented receiver concept. This section provides a more detailed description of an implementation example.

Figure 2:
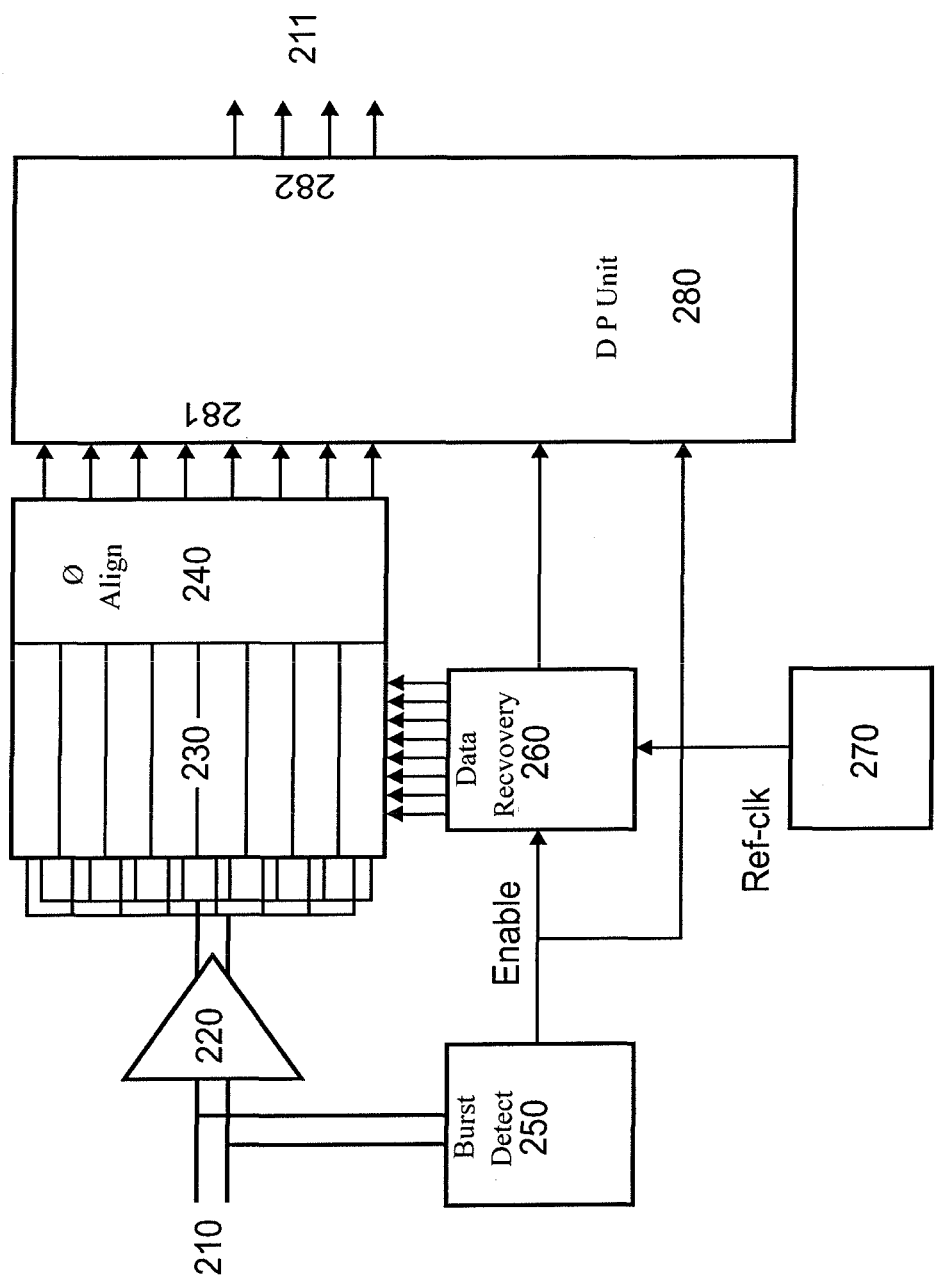
FIG. 2 shows a first asynchronous receiver architecture as an embodiment of the circuit according to the invention.

FIG. 2 shows a first asynchronous receiver architecture according to an embodiment of the invention. In particular, an asynchronous receiver architecture of the receiver front end is depicted. Serial data input 210 is inputted to an optional pre-amplifier 220 and a burst detect unit 250. The output of the optional pre-amplifier 220 is forwarded to samplers 230 and a phase alignment unit 240. The output of the phase alignment unit 240 is inputted to a digital data processing unit 280. These data correspond to over sampled data 281. The output of the burst detected unit 250 is forwarded as an enable signal to a multi-phase PLL and to the digital data processing unit 280. The multi-phase PLL 260 receives a reference clock Ref-clk from a local clock 270. The digital data processing unit 280 outputs recovered data 260 and recovered parallel data output 211.

Figure 3:
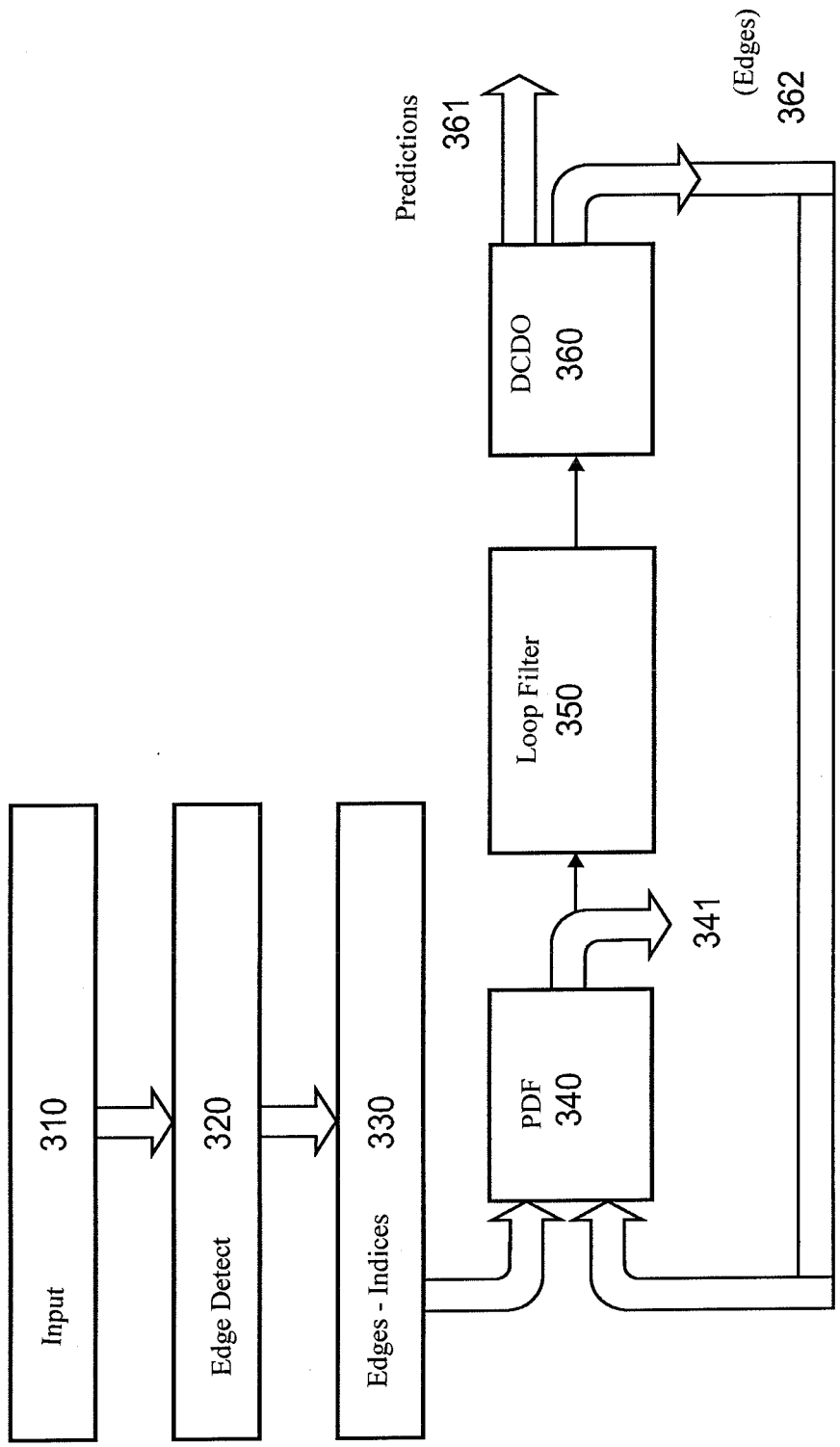
FIG. 3 shows a digital data-locked PLL as part of an embodiment of the control unit of a circuit embodying the circuit according to the invention.

FIG. 3 illustrates the architecture of the digital data-locked PLL. The blocks for enabling fast lock are left out for clarity reasons. The input 310 to the PLL block consists of a number of sampled bits (16). The amount of parallelism is an implementation choice and not fundamental to the concept.

These samples are processed to determine if there are any transitions (edge detect block 320). The location of these transitions are then determined and expressed as numbers (edges to indices block 330). There can be either 0 or 1 transition per bit, but the over-sampling ratio Q is not known during the architecture implementation; therefore the actual number of bits in the samples-word must be determined word by word. Depending on the amount of over-sampling and the actual data that is sampled, there can be 0, 1, 2, ... number of edges within one sampling word. The parallel phase-frequency detector (PFD) 340 uses all the edge locations to determine phase errors 341. The number of phase error values can therefore also vary per sample window.

A combination of a number of the calculated phase errors is passed to the loop filter 350. The loop filter 350 drives the DCDO (digitally controlled digital oscillator) block 360. The DCDO block 360 generates predictions 361 of where in the next sample window the bit transitions (edges) 362 can be expected.

The phase errors 341 are calculated by taking the difference between the actual edge locations (integer values) and the predicted edge locations (fixed point values). Since the number of actual edges can vary, the correct predicted edge locations need to be assigned to the actual locations. In an example implementation this is realized by calculating for every predicted edge the error with every actual edge. The combination of the predicted edge with the actual sampled edge that results in the smallest error is selected as a pair and results in an output phase error.

As is shown in FIG. 3, the complete set of calculated phase errors is available as output from the PLL. This set of phase errors can be combined with the predicted sample locations to obtain a more accurate estimate of the centre points of the over-sampled data bits. Traditionally the PLL output would be used directly to sample the actual data. This traditional method has the disadvantage that the jitter of the PLL is affecting the sampling location without suppression. Furthermore large additional phase errors can occur for changing frequencies because a PLL typically has phase-lagging filter characteristics.

By filtering the phase error signal and using the result to correct the previously calculated sample indices, de-jittered sample indices can be calculated. As an example, if a linear-phase filter is applied and the calculated sample indices are delayed by half the filter length, an averaging around the decision moment is obtained, including past, current, and future events (the latter is possible due to delay and storage) Instead of a linear-phase filter, an Infite Impulse Response (IIR) filter is another possibility. Another option is the use of a time-varying filter, which varies as function of e.g. the oversampled data provided, or another control signal.

Figure 4:
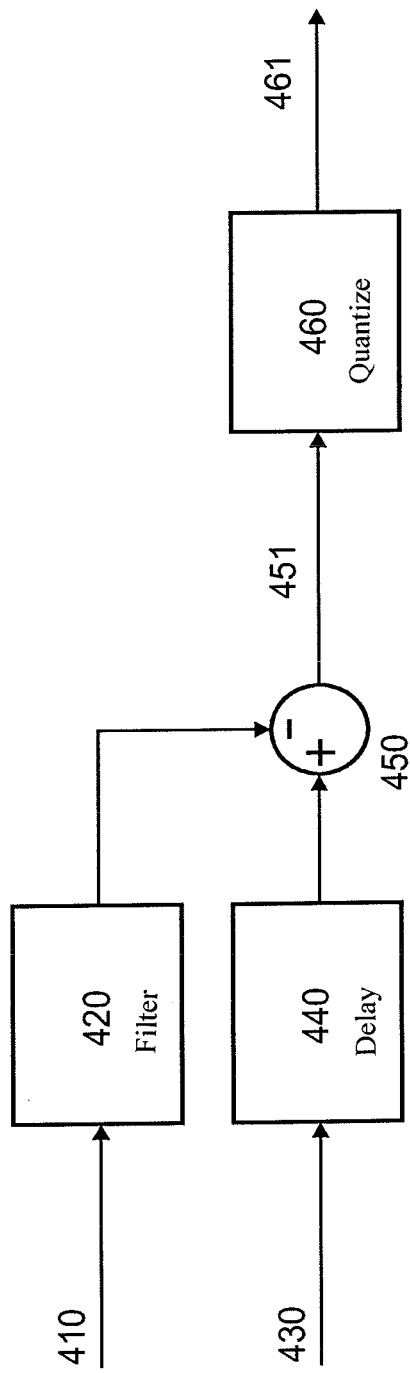
FIG. 4 shows a circuit to remove jitter from a signal in order to improve data integrity.
Figure 6:
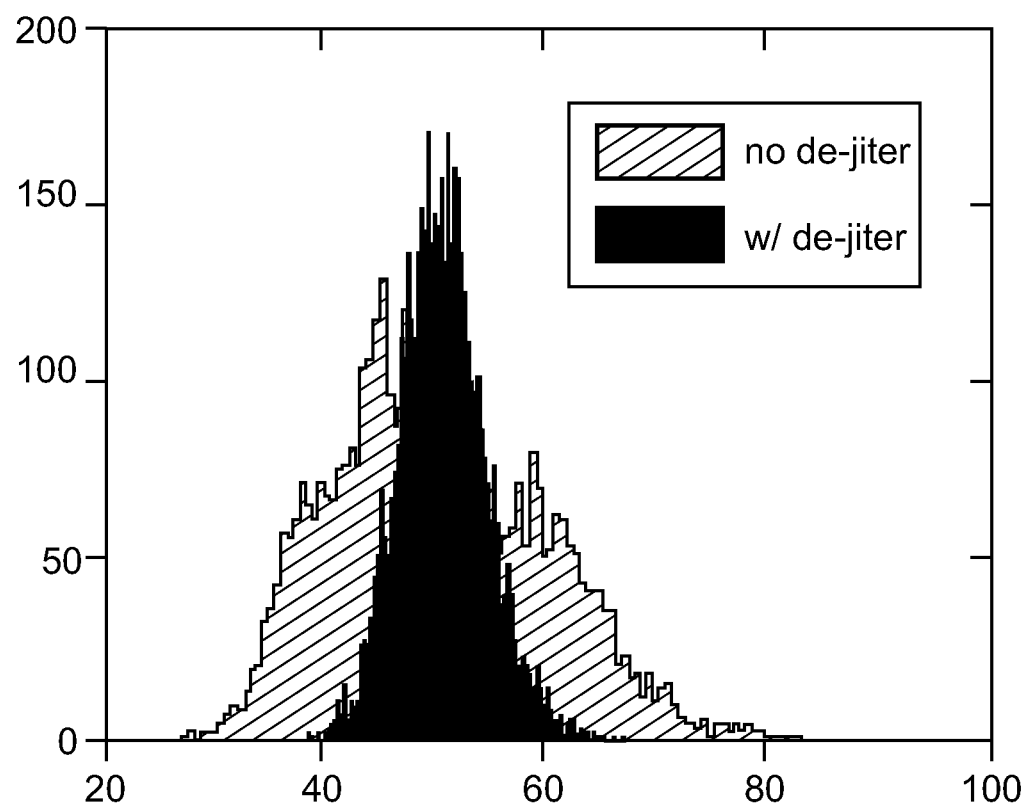
FIG. 6 shows results of data integrity improvement.

FIG. 4 shows the blocks required for de-jittering the sample indices. The phase errors 410 are inputted into a FIR filter 420 with (2N+1)-tabs. The displaced sample positions 430 are inputted into a time delay N-cycle unit 440. The output of the FIR filter unit 420 is substracted in a substraction unit 450 from the output of the delay unit 440. The output of the substraction unit 450 corresponds to the de-jittered sample positions 410 which are inputted into a sample quantization unit 460. The output of the quantization unit correspond to a select signal 461. Analog PLL frequency variations together with a limited digital PLL bandwidth can cause phase (lag) areas which may correspond to additional "jitter". This addition jitter can be cancelled by measuring the actual phase errors, averaging past, current and future phase errors (temporary sample storage), by applying a linear phase error filtering (constant group delay) and by correcting current sample indices. The improvement in estimated centre location before and after de-jitter is illustrated in FIG. 6. With this improved estimate of the sample location, more jitter from the PLL can be tolerated. This in turn can result in e.g. a cheaper digital implementation, or more relaxed constraints on the sampling clock. Alternatively, the bandwidth of the digital PLL can be increased, improving the tracking performance of changes in the over-sampling ratio, caused by varying transmitter or receiver clock frequencies. An increased bandwidth will also reduce the start-up (lock) time.

Figure 5:
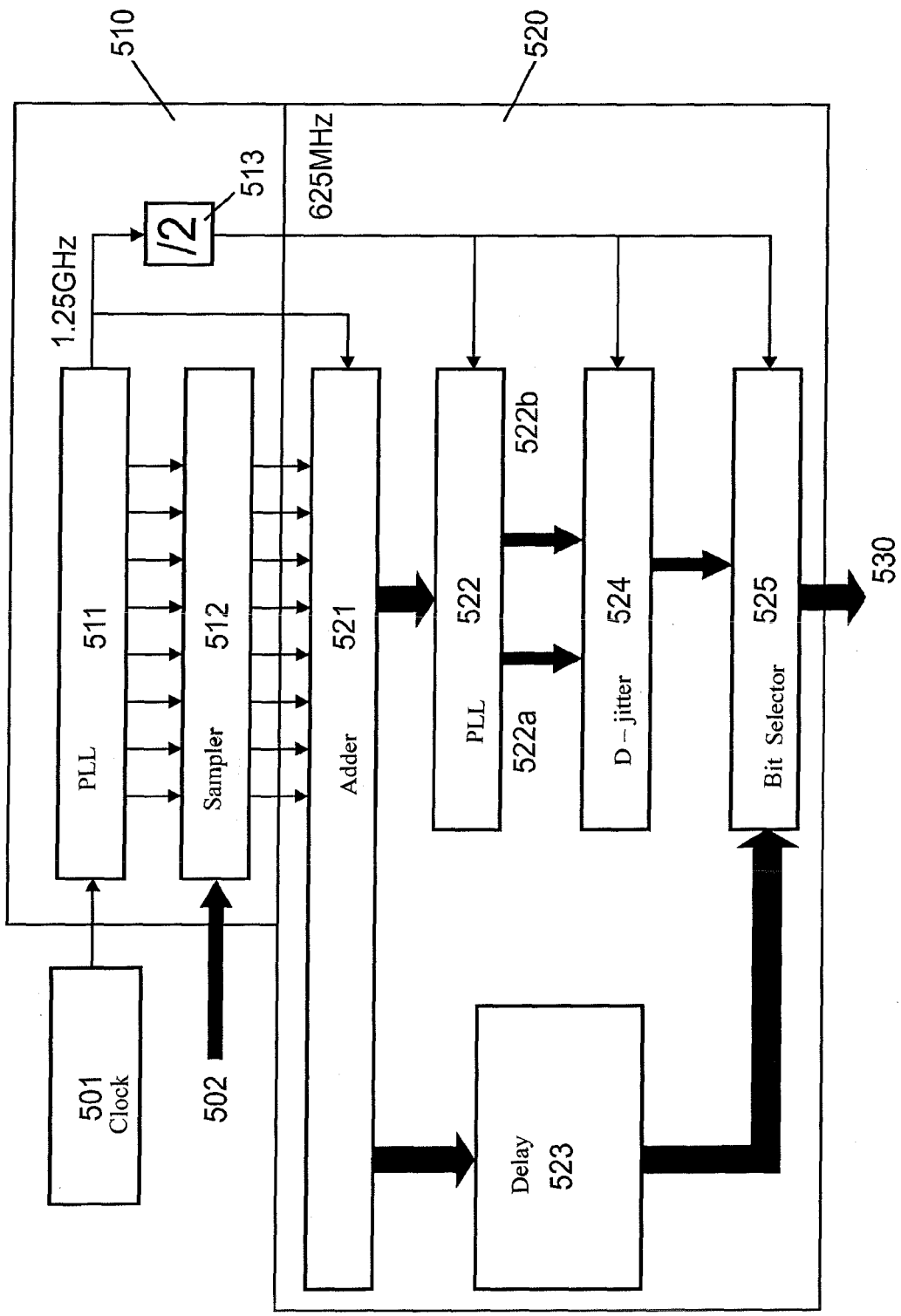
FIG. 5 shows a second asynchronous receiver architecture as an embodiment of the circuit according to the invention.

The combination of the PLL, the de jitter block, delay, and data sampling block is shown in the FIG. 5. In FIG. 5, an asynchronous receiver architecture is depicted. A local reference clock 501 is inputted into a first part 510 of the receiver. The analog input 502 is also inputted into the first part 510. In particular, the local reference clock 510 is inputted into an 8-phase PLL unit 511 with 10 Gs/s. The analog input 502 is inputted into a 8×1-bit sampler 512. The 8×1-bit sampler 512 also receives the output of the PLL unit 511. An output of the PLL unit 511 at 1.25 GHz is forwarded to the unit 521 which serves to add 8+8 bits at 625 MHz. The output of the unit 521 is forwarded to a delay unit 523 and to a data locked PLL 522. The data locked PLL 522 also receives an input of 625 MHz which corresponds to the output of the PLL unit 511 divided by two in the division unit 513. The output of the data locked PLL 522 corresponds to initial sample indices 522a and phase errors 522. These data are forwarded to the D-jitter unit 524 which outputs a D-jitter sample indices and forward this to the data bit selection unit 525 which also receives the output from the delay unit 523 and outputs bits 530.

Further invention embodiments:
Receiver concept with over-sampling front-end and advanced digital sample processing for data recovery. The invented concept does not require nearly equal (plesiochronous) clocks between transmitter and receiver as conventional systems do, but the clocks may be completely asynchronous.
The time position of the edges between bits (and therefore also the centre of bits) in the data stream is tracked with a much higher accuracy than the time grid as set by the sampling intervals. This is achieved by means of a digital PLL which tracks the average over-sampling ratio Q. Only the decision what the most reliable sample is to determine the value of the recovered data bit needs to be quantized to the most appropriate integer sample moment.
The received edge information is quantized to the sampling grid, but due to deterministic and random jitter in data stream and clocks the actual sampling moment is spread-out into a sampling window. This dithering-like behavior provides look-ahead phase information, which together with low-pass phase filtering provides an early indication of the phase trend.
The invented receiver concept can lock onto and track (slowly) varying data rate and/or accommodate for (slow) frequency variation of the receiver's sampling clock. Therefore this receiver concept enables fast synchronization to embedded clock data streams because the (analog) sample clock generation doesn't need to be fully stabilized.
An initialization sequence to estimate the over-sampling ratio (UIESTIMATE=QESTIMATE/fS~1/BIN) is advantageous for fast locking. This can easily achieved with a init sequence with a known edge density; QESTIMATE=#samples/#bits. For example in case of a toggling init sequence QESTIMATE=#samples/#edges. Such a QESTIMATE can also used to decide for sub-sampling (throwing away samples) before digital data processing in case the Q value is too high.
An initialization period to estimate the bit period as a fractional number of sample periods. A training period after the estimation has completed to train the digital data recovery block
A digital PLL with an 'oscillator' that predicts upcoming edge positions and compare these with the actual sampled edge positions to control the loop.
A PLL that outputs the phase error information to be used by other functions for improved phase tracking
A fast-training mechanism by resetting the phase error in order to avoid cycle slips
A de-jittering phase correction mechanism by filtering the phase errors detected in the PLL and correcting the predicted sample positions from the PLL loop before selecting the most appropriate samples to be used for further bit level decision algorithms.
PLL is a Phase-Locked Loop.
Clock generation and/or multiplication in a transmitter and receiver by means of (potentially multi-phase) PLLs like shown on slide 20 en 23 can also be realized with DLLs (Delay locked loops). A PLL has the advantage of smoother phase behavior if the clock has not been fully phase synchronized.
A multi-phase PLL is a PLL where the (multi-phase) oscillator generate multiple phase of a clock signal in parallel For example: An 8-phase 1.25 GHz means all 8 clocks are 360/80=45 degrees phase shifted version of the 1.25 GHz clock. In fact it is conceptually also possible to use one 8*1.25 GHz=10 GHz sample clock, but that requires much more circuit speed. Therefore multi-phase is a good technique to increase sample rate without significant increase of circuit speed requirements. Multi-phase is not essential for this ID. But this technique eases implementation, if the sample rate become very high related to circuit speed.
Multi-phase is used for parellellism and reduced circuit speed requirements. Multi-phase clocks require multiple samplers. The multi-phase sample results are not phase aligned to one clock, but each of them to one (sub)phases. Therefore a alignment to one clock is required. This is done in the phase align block in FIG. 2.

FIG. 7 shows a basic function performed by the digital processing. Here, digital requirements are depicted. An analog input data bit stream 701 is inputted into an analog PLL and samplers block 710. The output of the analog PLL and the sampler unit 710 is forwarded to the digital clock recovery block 720. The output of the digital clock recovery block 720 is forwarded to the digital phase tracking block 730 and its output is forwarded to the digital data selection block 740 which outputs digital output recovered bits 702. Accordingly, more than 3×OSR is achieved. Furthermore, a fast frequency locking, a fast phase tracking is achieved. Although fast hardware is needed, a simple implementation of the algorithms can be achieved.

Figure 8:
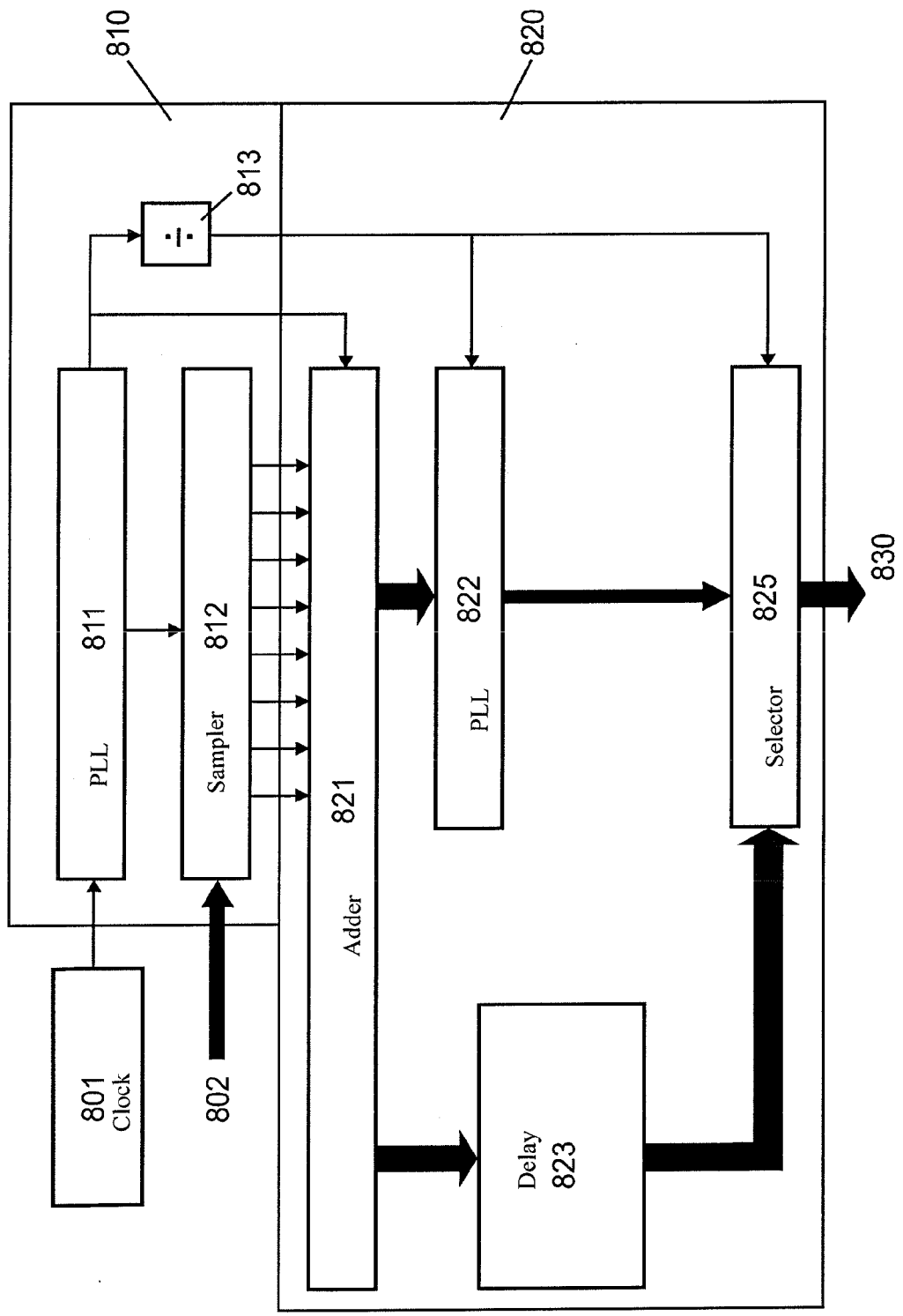
FIG. 8 shows a very simple embodiment of the circuit according to the invention.

FIG. 8 shows a block diagram of a circuit according to the invention. Here, an asynchronous receiver architecture is depicted. A local reference clock 801 is inputted into an 1-phase PLL unit 810 and an analog input 802 is inputted into a 8×1-bit sampler 812. The output of the PLL unit 811 is forwarded to a unit 821 and is divided in a division unit 813. The output of the division unit 813 is forwarded to the data locked PLL unit 822 and the data bit selection unit 825. The unit 821 forwards its output to the delay unit 823 and the data locked PLL 822 which outputs simple indices to the data bit selection unit 825.

Figure 9:
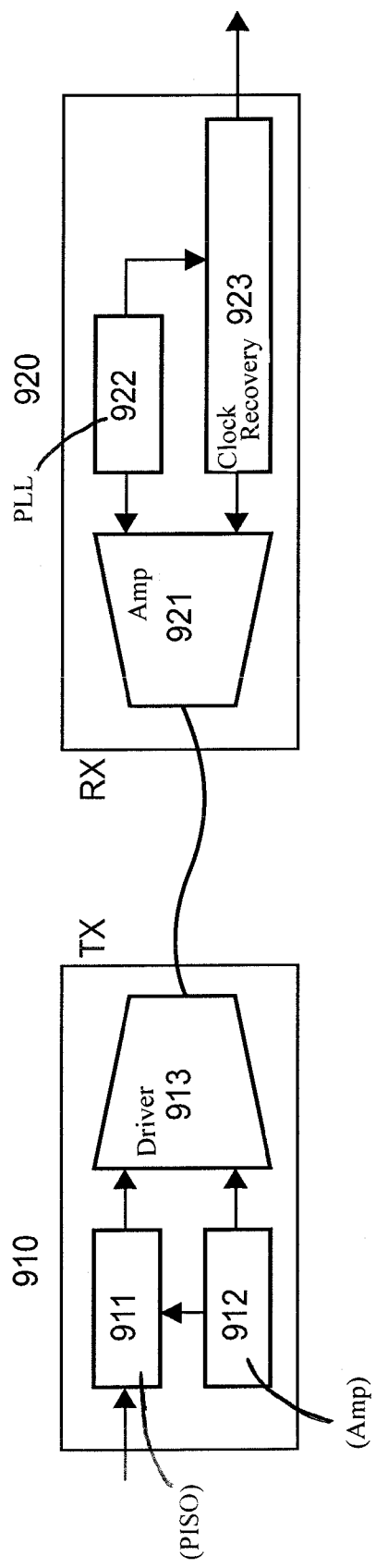
FIG. 9 shows an embodiment of the system according to the invention.

FIG. 9 shows an embodiment of the system according to the invention. Here, the system may comprise a transmitter TX910 and a receiver RX920. The transmitter TX910 comprises a PISO unit 911, a PLL unit 912 and a driver unit 913 which receives the output of the PLL unit 912 and the output of the PISO unit 911. The receiver RX920 comprises an amplifier and sampled unit 921, a PLL unit 922 and a clock data recovery unit 923. Employing a circuit employing an embodiment of the invention (either circuit or method) allows freedom at the transmitter end:

Don't wait until the TX PLL frequency is absolutely stable, but make changes slow enough so that the RX can track it.

Don't let the analog RX PLL search the frequency very slowly, but use a quick fast frequency search mechanism for initialization or even better: preset the analog PLLs tune-voltage, enabling very fast and accurate if consecutive bursts are at similar rates; even a rough estimate can improve lock time significantly.

Don't wait for accurate phase settling of the analog RX PLL, but make phase settling slow enough so that the digital PLL can track it.

Don't let the digital PLL start-off with random data, but give it a head-start by means of a training sequence The digital PLL tracks momentary relative frequency and phases is controlled by comparing predicted phase and actual samples.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa. When data is being referred to as audiovisual data, it can represent audio only, video only or still pictures only or a combination thereof, unless specifically indicated otherwise in the description of the embodiments.

In the description above, it will be understood that when an element such as layer, region or substrate is referred to as being "on" or "onto" another element, the element is either directly on the other element, or intervening elements may also be present.

Furthermore, the invention may also be embodied with less components than provided in the embodiments described here, wherein one component carries out multiple functions. Just as well may the invention be embodied using more elements than depicted in FIG. 5, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

In summary, the invention relates to the following:

The invention relates to a circuit and method for receiving a signal of which—at the receiver end—the frequency is basically unknown. By sampling the data and deriving the frequency of the signal (or actually: the data rate of the data carried by the signal) and setting a phase locked loop in the receiver to the derived—estimated—circuit, the receiver can very quickly tune in to the frequency of the signal. Hence, no embedded or accompanying clock is required for the signal. Oversampling of the signal by the receiver front end is preferred, though.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. A method of receiving data by a receiver with a phase locked loop, the data being carried by a signal having a frequency unknown by said receiver, the method comprising the steps of:
    a) Sampling the signal at a pre-determined sampling rate;
    b) Estimating the frequency of the signal;
    c) Setting the frequency of the phase locked loop to match the estimated frequency;
    d) Setting the phase of the phase lock loop to zero for the estimated zero phase error;
    e) Running the phase locked loop for a pre-determined amount of cycles; and
    f) When the phase locked loop has not locked on the phase of the signal after the pre-determined amount of cycles, repeating steps b-f until the phase is locked.

2. The method according to claim 1, wherein the pre-determined sampling rate is equal to at least two times the maximum frequency that the signal is expected to have.

3. The method according to claim 1, wherein the signal comprises a pre-determined sequence to facilitate estimation of the frequency of the signal.

4. The method according to claim 3, wherein the predetermined sequence is a sequence of alternating binary values.

5. The method according to claim 1, further comprising the step of aligning output signals of multiple sampling units to one single clock signal, wherein the sampling step is performed by the multiple sampling units, and wherein the sampling units operate at different sampling phases.

6. The method according to claim 1, wherein the data's rate is equal to the frequency of the signal.

7. The method according to claim 1, wherein the estimating step comprises:
   a) interpreting the sampled values as either being a logical 1 or a logical 0;
   b) detecting transitions in the consecutively sampled and interpreted values;
   c) feeding information on the transitions to a phase-frequency detector of a further phase locked loop; and
   d) using the output of the phase locked loop to estimate the frequency of the signal.

8. A circuit for receiving data carried by a signal having a frequency unknown by said receiver, the receive comprising:
   a) at least one sampling unit for sampling the signal at a pre-determined sampling rate;
   b) a first phase locked loop operatively coupled to the sampling unit;
   c) a control unit operatively coupled to an output of the sampling unit and operatively coupled to the first phase locked loop, the control unit being configured to:
      i) estimate the frequency of the signal;
      ii) set the frequency of the first phase locked loop to match the estimated frequency;
      iii) set the phase of the first phase locked loop to zero phase error;
      iv) let the first phase locked loop run for a pre-determined amount of cycles; and
      v) when the first phase locked loop has not locked on the phase of the incoming signal after the pre-determined amount of cycles, repeat steps i-v until the phase is locked.

9. The circuit according to claim 8, wherein the control unit configured to estimate the frequency of the signal, further comprises:
   a) a unit for detecting transitions in the sampled signal of which input is operatively coupled to the sampling unit;
   b) a second phase locked loop of which input of a phase-frequency detector is operatively coupled to an output of the unit for detecting transitions, the second phase locked loop comprising an oscillator from which output signal, during operation, the estimated frequency of the signal can be derived.

10. The circuit according to claim 8, wherein the at least one sampling unit includes n sampling units, each of the n sampling units being driven by n respective clock signals having different phases, the circuit further comprising an alignment unit for aligning output signals of the n sampling units to one clock signal, the output of the alignment unit being operatively coupled to the control unit.

11. The circuit according to claim 10, wherein the phase of each of the n respective clock signals is 2/n.

12. A circuit for receiving data carried by a signal having a frequency unknown by said receiver, the receive comprising:
   a) at least one sampling unit for sampling the signal at a pre-determined sampling rate;
   b) a first phase locked loop operatively coupled to the sampling unit;
   c) a control unit operatively coupled to an output of the sampling unit and operatively coupled to the first phase locked loop, the control unit being configured to:
      i) estimate the frequency of the signal;
      ii) set the frequency of the first phase locked loop to match the estimated frequency;
      iii) set the phase of the first phase locked loop to zero phase error;
      iv) let the first phase locked loop run for a pre-determined amount of cycles; and
      v) when the first phase locked loop has not locked on the phase of the incoming signal after the pre-determined amount of cycles, repeat steps i-v until the phase is locked, wherein each cycle of the predetermined number of cycles includes a plurality of cycles less than a number of cycles necessary for phase error to increase to 180 degrees.

13. The circuit according to claim 12, wherein:
   each cycle of the predetermined number of cycles increases the phase error by X degrees; and
   the predetermined number of cycles is equal to the quotient of 180 divided by X.

14. The method according to claim 2, wherein the pre-determined sampling rate is equal to a non-integer multiple of the maximum frequency that the signal is expected to have.

* * * * *